US006178361B1

(12) United States Patent
George et al.

(10) Patent No.: US 6,178,361 B1
(45) Date of Patent: Jan. 23, 2001

(54) AUTOMATIC MODULAR WAFER SUBSTRATE HANDLING DEVICE

(75) Inventors: Gregory George, Colchester; Tim Peery, Jericho; Timothy Consentino, Waitsfield; Michael Kuhnle, Morrisville; Seth Wright, Essex Junction; James Ziegler, East Barre, all of VT (US)

(73) Assignee: Karl Suss America, Inc., Waterbury Center, VT (US)

( * ) Notice: Under 35 U.S.C. 154(b), the term of this patent shall be extended for 0 days.

(21) Appl. No.: 09/197,212

(22) Filed: Nov. 20, 1998

(51) Int. Cl.[7] ........................................................ G06F 7/00
(52) U.S. Cl. .................... 700/213; 414/222; 414/217; 414/935; 414/939
(58) Field of Search ..................................... 700/213, 228, 700/222; 414/935, 939, 217, 938, 941, 225

(56) References Cited

U.S. PATENT DOCUMENTS

| | | | | |
|---|---|---|---|---|
| 4,523,985 | * | 6/1985 | Dimock ................................ | 204/298 |
| 4,559,718 | * | 12/1985 | Tadokoro ............................... | 34/8 |
| 4,717,461 | * | 1/1988 | Strahl et al. ......................... | 204/192.1 |
| 4,722,298 | * | 2/1988 | Rubin et al. .......................... | 414/222 |
| 4,763,602 | * | 8/1988 | Madan et al. ......................... | 118/719 |
| 4,764,076 | * | 8/1988 | Layman et al. ....................... | 414/217 |
| 4,790,258 | * | 12/1988 | Drage et al. ......................... | 118/500 |
| 4,801,241 | * | 1/1989 | Zajac et al. .......................... | 414/786 |
| 4,825,808 | * | 5/1989 | Takahashi et al. .................... | 414/217 |
| 4,851,101 | * | 7/1989 | Hutchinson .......................... | 204/298 |

(List continued on next page.)

Primary Examiner—Christopher P. Ellis
Assistant Examiner—Khoi H. Tran
(74) Attorney, Agent, or Firm—Eric R. Benson, Esq.

(57) ABSTRACT

The object of the invention is to provide an automatic module and cassette station detecting and aligning semiconductor wafer/substrate material handling unit with a thermal processing chamber module having an integrated, sturdy, chemical and temperature resistant wafer lift pins and door actuation apparatus. One of the benefits that is derived from this apparatus is the ability to quickly and easily attach various processing modules at any docking position of the semiconductor wafer/substrate material handling unit (hereinafter MHU). The MHU of this apparatus has the additional benefit of a cassette station that automatically aligns and detects a plurality of different size and shape semiconductor wafer/substrate cassettes. The semiconductor wafer/substrate cassettes may also be functionally attached to a module that is docked to the MHU for use. A further benefit of this apparatus is the ability to cluster MHUs providing for the use of additional modules, all of which may be controlled by one central processing unit. Additionally the modules and MHU are specifically designed to dock and lock utilizing a locating mechanism which places the module in the precise location with respect to the MHU for use. Once the module is docked and then locked the exhaust interface between the module and the MHU self-aligns and self-seals. In a Thermal Processing Chamber module utilizing the benefits of the aforementioned modularity, docking and locking, clustering, and exhaust interfacing, this invention further enure the benefit of an integrated compact wafer lift pin and door actuation mechanism which provides for a low-profile lift pin mechanism that maintains the lift pins at a level position during operation and an integrated chamber door utilizing one prime mover and one control path which simplifies operation and reduces parts count and improves the reliability of the module's precise acceptance and delivery of a wafer from the MHU. In yet another benefit of this disclosure in the Thermal Processing Chamber module this invention utilizes thermal processing chamber lift pins comprised of materials of very low thermal conductivity which are sturdy, chemical and temperature resistant and hence minimize the pins thermal effect on the resist coating thickness applied to a wafer.

1 Claim, 14 Drawing Sheets

U.S. PATENT DOCUMENTS

| | | | |
|---|---|---|---|
| 4,869,801 | * | 9/1989 | Helms et al. .......................... 204/298 |
| 4,917,556 | * | 4/1990 | Stark et al. .......................... 414/217 |
| 5,076,205 | * | 12/1991 | Vowles et al. ....................... 118/719 |
| 5,246,218 | * | 9/1993 | Yap et al. ............................ 269/309 |
| 5,314,574 | * | 5/1994 | Takahashi ........................... 156/646 |
| 5,462,397 | * | 10/1995 | Iwabuchi ............................. 414/222 |
| 5,474,410 | * | 12/1995 | Ozawa et al. ....................... 414/217 |
| 5,484,483 | * | 1/1996 | Kyogoku ............................. 118/719 |
| 5,492,862 | * | 2/1996 | Misumi ................................ 437/173 |
| 5,651,823 | * | 7/1997 | Paradi et al. ........................ 118/500 |
| 5,702,533 | * | 12/1997 | Mundt et al. ....................... 118/733 |
| 5,733,024 | * | 3/1998 | Slocum et al. .................... 312/223.2 |
| 5,762,745 | * | 6/1998 | Hirose ................................. 156/345 |
| 5,823,736 | * | 10/1998 | Matsumura ......................... 414/609 |
| 5,841,515 | * | 11/1998 | Ohtani ................................... 355/27 |
| 5,848,670 | * | 12/1998 | Salzman .............................. 187/272 |
| 5,851,296 | * | 12/1998 | Haraguchi et al. ................. 414/786 |
| 5,860,640 | * | 1/1999 | Marohl et al. ...................... 269/289 |
| 5,879,128 | * | 3/1999 | Tietz et al. .......................... 414/757 |
| 5,883,017 | * | 3/1999 | Tepman et al. ..................... 438/800 |
| 5,883,522 | * | 3/1999 | O'Boyle .............................. 324/765 |
| 5,895,549 | * | 4/1999 | Goto et al. .......................... 156/345 |
| 5,909,994 | * | 6/1999 | Blum et al. .......................... 414/217 |
| 5,970,621 | * | 10/1999 | Bazydola et al. ..................... 33/613 |
| 5,989,342 | * | 11/1999 | Ikeda et al. ........................... 118/52 |
| 5,989,346 | * | 11/1999 | Hiroki ................................. 118/719 |
| 6,068,441 | * | 5/2000 | Raaijmajers et al. ............... 414/609 |

* cited by examiner

AUTOMATIC MODULAR WAFER SUBSTRATE HANDLING DEVICE

TECHNICAL FIELD OF THE INVENTION

The present invention relates to an automatic module and cassette station detecting and aligning semiconductor wafer/substrate material handling unit (hereinafter MHU) with a thermal processing chamber module having an integrated, sturdy, chemical and temperature resistant wafer lift pins and door actuation apparatus, and more particularly pertains to an apparatus which automatically detects and aligns different size and shape semiconductor wafer/substrate cassettes that will also allow the clustering of semiconductor wafer/substrate material handling units that will permit the automatic alignment and exhaust sealing of a multiplicity of portable modules at least one of which include a thermal processing chamber module that utilizes sturdy, chemical and temperature resistant low profile lift pins which permit the precise acceptance and delivery of a wafer from the material handling unit while opening and closing the thermal processing chamber door with one prime mover and one control path with a minimal thermal impact on the resist coating thickness of the wafer.

BACKGROUND ART

The use of semiconductor wafer/substrate material handling units in industry is known in the prior art. For instance, U.S. Pat. No. 4,722,298 (R. Rubin et al.—Feb. 2, 1988) discloses a self contained modular processing device for semiconductor wafers comprising a chassis with an integral processing module adapted to perform at least one function, i.e. coating or baking etc. The Rubin et al. patent discloses a "building block" concept with "plug in" modular processing to accomplish a multi-functioning system capable of handling a silicon wafer in multiple directions, including "parallel or branch" tracks. Rubin et al. teaches a modular processing apparatus comprised of one or two chassis about which are attached modules. The patent further teaches the integration of a CPU for controlling the processing of the workpiece. The Rubin, et al., patent further describes the modules as standard industry modules known in the industry. Similarly, U.S. Pat. No. 4,851,101 (M. Hutchinson—Jul. 25, 1989) discloses a sputter coating module for a multi-function device comprising a chamber means capable of holding a vacuum and also has a port to accept a wafer for processing. The Hutchinson device has a means for rotatable wafer support as well as a means to sputter coat the wafer and the disclosure teaches and claims a coating module which utilizes vacuum and gas port systems to perform the sputter deposition.

U.S. Pat. No. 4,801,241 (J. Zajac, et al.—Jan. 31, 1989) discloses another modular article processing machine for semiconductor wafers and method of article handling comprising the steps of transferring articles simultaneously from location to location until all modular chambers contain unprocessed articles and then simultaneously processing the articles until all articles are placed in an output chamber having completed the processing. Zajac et al. also teaches an additional method wherein there is at least two processing stations. Like Zajac, et al., U.S. Pat. No. 4,825,808 (N. Takahashi, et al.—May 2, 1989) discloses a substrate processing device comprising "modular" input and output chambers wherein substrates may be loaded and unloaded for purposes of processing.

U.S. Pat. No. 4,917,556 (L. Stark et al.—Apr. 17, 1990) discloses still another modular semiconductor wafer processing machine comprising interconnected handling units, each with wafer handling arms which are in turn capable of passing a wafer to another unit in a vacuum environment through ports which are opened and closed by valve means. This invention discloses a gate means to isolate material handling units for purposes of processing workpieces. Then in U.S. Pat. No. 5,474,410 (M. Ozawa, et al.—Dec. 12, 1995) it discloses a multi-chambered processing unit with cassette carrier comprising cassette chambers into and out of which a plurality of substrate cassettes are carried under pressure and a series of load lock chambers between which the substrates may be carried and the substrate is also carried within a series of vacuum process chambers. This patent discloses cassette chambers which are small in size which prevents the substrates from coming out of the cassette when the cassette is carried into and out of the chambers and which also do not interfere with components functioning.

The aforementioned prior art of semiconductor wafer/substrate material handling units generally involve lengthy, labor intensive and error prone assembly of processing units to a material handling unit which do not permit portable modularity, clustering and multi-tasking. For instance, U.S. Pat. No. 5,733,024 (A. Slocum, et al.—Mar. 31, 1998) discloses a modular system with a plurality of mounted modules at pre-determined locations by means of kinematic couplings comprising a rigid frame to which a plurality of modules are attached by kinematic couplings such that the frame forms a common substrate with the module defining a global set of reference axes which are set in a pre-determined relationship with each type of module. These couplings utilize three aligning element pairs which serve to define six contact surfaces. This prior art also involves a lengthy, error prone manual adjustment to accommodate the handling of different size and shape wafers. The application of such art is primarily in the processing of semiconductors where photoresist polymer coatings are applied and bonded to wafers of various sizes and shapes. These applications are limited, however, since they are generally unable to allow for material handling units to be portably clustered and connected to portable self aligning process modules. Also in U.S. Pat. No. 5,076,205 (E. J. Vowles, et al.—Dec. 31, 1991) it discloses a multichamber system for processing of semiconductor wafers comprising a portable processing chamber assembly which is matable with a stationary multi-processing station which incorporates a means for releasably docking a mobile housing with a stationary multi-processing station.

These prior art applications also do not provide for interfacing of portable process modules that are automatically recognized by the material handling unit central processor. The prior art generally requires a lengthy manual procedure of attaching a process unit or module to a material handling unit which is not self-aligning and not self-sealing. The prior art also does not provide for the automatic detection and alignment of the semiconductor wafer/substrate cassette station requiring that a manual adjustment be made when a different size or shape of wafer is introduced to the system for processing.

The prior art also does not disclose a semiconductor wafer/substrate material handling unit with a thermal processing chamber which utilizes compact, sturdy, chemical and temperature resistant lift pins which are integrally connected to the door mechanism, and are both engaged by one motor action. U.S. Pat. No. 5,484,483 (M. Kyogoku—Jan. 16, 1996) discloses a thermal treatment device for semiconductor materials designed to prevent metal contamination, maintaining a sealed and isolated environment between the wafer transfer system and thermal chamber despite pressure differences between the chambers. The workpiece in Kyogoku is placed in the thermal treatment chamber by moving a boat supporting workpieces and does not disclose a support or lift pin configuration as is disclosed in the present invention. The Kyogoku patent teaches atmospherically isolated thermal processing units which are engineered to prevent metal contamination of the workpiece. Unlike the present invention the prior art utilizes lifting mechanisms with relatively high thermal conductivity and substantial surface area contact with the wafer being coated which can thermally affect the resist coating of the wafer in an adverse manner.

The prior art is also bulky in size and take up as much as sixty-six percent (66%) more floor space than the invention disclosed herein. As such, the basic concept of automatic module and cassette station detecting and aligning semiconductor wafer/substrate material handling unit with a thermal processing chamber module having an integrated, sturdy, chemical and temperature resistant wafer lift pins and door actuation apparatuses and their use are disclosed.

While the prior art discloses semiconductor wafer/substrate material handling unit apparatuses which fulfill their respective particular objectives and requirements, and are most likely quite functional for their intended purposes, it will be noticed that none of the prior art cited disclose a device that allow for the clustering of material handling units which further easily and automatically self-align and seal-seal precisely in place for operation, several differing process modules, or any combination of modules thereof, which are automatically recognized and controlled by the material handling unit's central processor. Further, the prior art does not utilize automatic alignment and detection of semiconductor wafer/substrate cassette stations. In particular U.S. Pat. No. 5,246,218 (H. Yap et al.—Sep. 21, 1993) discloses a device for securing an automatically loaded wafer cassette on a processing device platform comprising two guiding means which are further comprised of base bars and front and side walls which automatically and precisely align the wafer cassette once the two guiding means have received the cassette upon manual placement, however, this patent's securing means does not teach or claim automatic cassette or wafer size detection as the present invention.

Also, none of the prior art utilizes a thermal processing chamber with sturdy, chemical and temperature lift pins which actuate integrally with the thermal processing chamber door with one motor in a manner which minimizes the lifting mechanisms thermal impact upon a wafer being processed in the chamber. As such, there apparently still exists the need for new and improved semiconductor wafer/substrate material handling unit with a thermal processing chamber apparatuses which can be operated without extensive manual adjustment by providing for self-aligning and self-sealing portable modules that are automatically recognized by the central processing unit of the material handling unit and utilize thermal processing chambers which lift the wafers being processed with sturdy, chemical and temperature resistant lift pins that are integrally actuated with the door mechanism by a single motor action and further automatically detects and aligns to accommodate differing wafer sizes and shapes present in the cassette station. In this respect, the present invention disclosed herein substantially fulfills this need.

DISCLOSURE OF THE INVENTION

In view of the foregoing limitations inherent in the known types of semiconductor wafer/substrate material handling units and attached processing units apparatuses now present in the prior art, the present invention provides an apparatus that has been designed to allow the clustering of material handling units which may be operated without extensive manual adjustment by providing for self-aligning and self-sealing portable process modules that are automatically recognized by the central processing unit of the material handling unit and utilize thermal processing chambers which lift the wafers being processed with a multiplicity of sturdy, chemical and temperature resistant lift pins that are integrally actuated with the door mechanism by a single motor action and further automatically detects and aligns to accommodate differing wafer sizes and shapes present in the cassette station, which are improvements which are patently distinct over similar devices which may already be patented or commercially available. As such, the general purpose of the present invention, which will be described subsequently in greater detail, is to provide a new, novel and useful automatic module and cassette station detecting and aligning semiconductor wafer/substrate material handling unit with a thermal processing chamber module having an integrated, sturdy, chemical and temperature resistant wafer lift pins and door actuation apparatus. There are many additional novel features directed to solving problems not addressed in the prior art.

To attain this, the present invention generally comprises a semiconductor wafer/substrate material handling unit (hereinafter MHU). The MHU contains a robot, robot controller, main computer, AC distribution services to each module and user interface. The modules are self contained wafer processing stations capable of performing various module specific functions, such as thermal processing of wafers. The modules are connected to the MHU utilizing a docking system which precisely aligns the module with respect to the robot and exhaust system interface and once docked it automatically seals the exhaust interface. The docking system utilizes docking ramps pivotally attached to the MHU where the modules are secured. The docking ramps may be folded away when not in use thereby reducing the footprint of the MHU. The additional support services such as power, air pressure, nitrogen, vacuum and exhaust are provided by the MHU for each such module.

Several MHUs may be clustered together to facilitate several modules which would handle wafers through the cluster by a single main computer. Any number of MHUs may be clustered together with MHU extensions to accommodate additional processing modules, all of which would be controlled by a single main computer.

The processing modules of the present invention are engineered to be located and fully operational at any docking location or position for any MHU configuration whether a single MHU or clustered MHU configuration. With the docking system of this invention a module may be replaced and/or serviced without disturbing the rest of the system and its operation utilizing other docked modules. The processing modules each contain a function specific microprocessor which is connected to the main computer and communicates to the system the presence, status and location of the processing module. The precise nature of the docking system together with the individual module microprocessing units provide for the standardization of the processing modules' statistics such that the interface and interaction with the robot placing wafer/substrate materials within the processing modules will not have to be relearned or otherwise adjusted after the attachment of a module, regardless of which docking station is used.

In the use of the present invention, a semiconductor wafer/substrate cassette containing the wafer/substrates to be processed is placed on a platform in the MHU automatically constraining two parameters of the cassette's orientation in space relative to the robot. A bar on the cassette located in slots of two jaws further define the cassette's orientation in space relative to the robot including rotational orientation. A user actuated switch commands the two jaws to travel in a synchronous opposed motion until contacting the runners on the cassette positioning it centrally about a point defining the final orientation in space of the cassette. A linear encoder automatically measures the distance between the jaws and communicates this information together with two discrete switches to the main computer, or central processing unit. The MHU having this information now "knows" what size/shape cassettes are in place for processing.

The present invention is designed to dock with a number of different portable process modules at any docking station without requiring reconfiguration of the MHU. The present invention includes a portable thermal processing chamber module. This thermal processing chamber module utilizes sturdy, chemical and temperature resistant low profile lift pins which are integrally attached to the processing chamber's door. The lift pins and door are actuated by the same mechanism such that only one primary mover or motor and one control path is required. This simplifies the operation, reduces the parts costs and improves reliability. The lift pins are designed to minimize thermal impact on the wafers being processed in the module by reducing surface area contact and thermal loss. The lift pins are made of a sturdy, chemical and temperature resistant material and may have a castellated pin tip geometry to further reduce thermal impact upon the wafer being processed in the module.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention, method and apparatus, is not limited in its application to the details of construction and to the arrangements of the components set forth in the following description or illustrated in the drawings. The invention, method of its use and apparatus, is capable of other embodiments and of being practiced and carried out in various ways. Also, it is to be understood that the phraseology and terminology employed herein are for the purpose of description and should not be regarded as limiting in any way the scope of this invention or claims made herein.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions and methods insofar as they do not depart from the spirit and scope of the present invention.

Further, the purpose of the foregoing abstract is to enable the U.S. Patent and Trademark Office and the public generally, and especially the scientists, engineers, and practitioners in the art who are not familiar with patent or legal terms or phraseology, to determine quickly from a cursory inspection, the nature and essence of the technical disclosure of the application. The abstract is neither intended to define the invention of the application, which is measured by the claims, nor is it intended to be limiting as to the scope of the invention in any way.

It is therefore an object of the present invention to provide a new, novel and useful automatic module and cassette station detecting and aligning semiconductor wafer/substrate material handling unit with a thermal processing chamber module having an integrated, sturdy, chemical and temperature resistant wafer lift pins and door actuation apparatus which has many of the advantages of the semiconductor wafer/substrate material handling unit and attached processing units apparatuses mentioned heretofore and many novel features that result in a semiconductor wafer/substrate material handling unit and attached processing units apparatus which is not anticipated, rendered obvious, suggested, or even implied by any of the prior art semiconductor wafer/substrate material handling units and attached processing units apparatuses, either alone or in any combination thereof.

It is another object of the present invention to provide a semiconductor wafer/substrate material handling units and attached processing units apparatus which may be easily and efficiently manufactured, taught and marketed.

It is a further object of the present invention to provide a semiconductor wafer/substrate material handling units and attached processing units apparatus which is of a durable and reliable construction.

An even further object of the present invention is to provide a semiconductor wafer/substrate material handling units and attached processing units apparatus which is susceptible of a low cost of manufacture with regard to both materials and labor, and which accordingly is then susceptible of low prices of sale to the consuming public, thereby making such semiconductor wafer/substrate material handling units and attached processing units apparatuses economically available to the buying public.

Still yet another object of the present invention is to provide a semiconductor wafer/substrate material handling units and attached processing units apparatus which provides in the apparatuses of the prior art some of the advantages thereof, while simultaneously overcoming some of the disadvantages normally associated therewith.

These together with other objects of the invention, along with the various features of novelty which characterize the invention, shall be pointed out with particularity in the claims annexed to and forming a part of this disclosure upon the filing of the full application. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other that those set forth above will become apparent when consideration is given to the following detailed description thereof. Such description makes reference to the annexed drawings wherein.

BEST MODE FOR CARRYING OUT THE INVENTION

Figure 1:
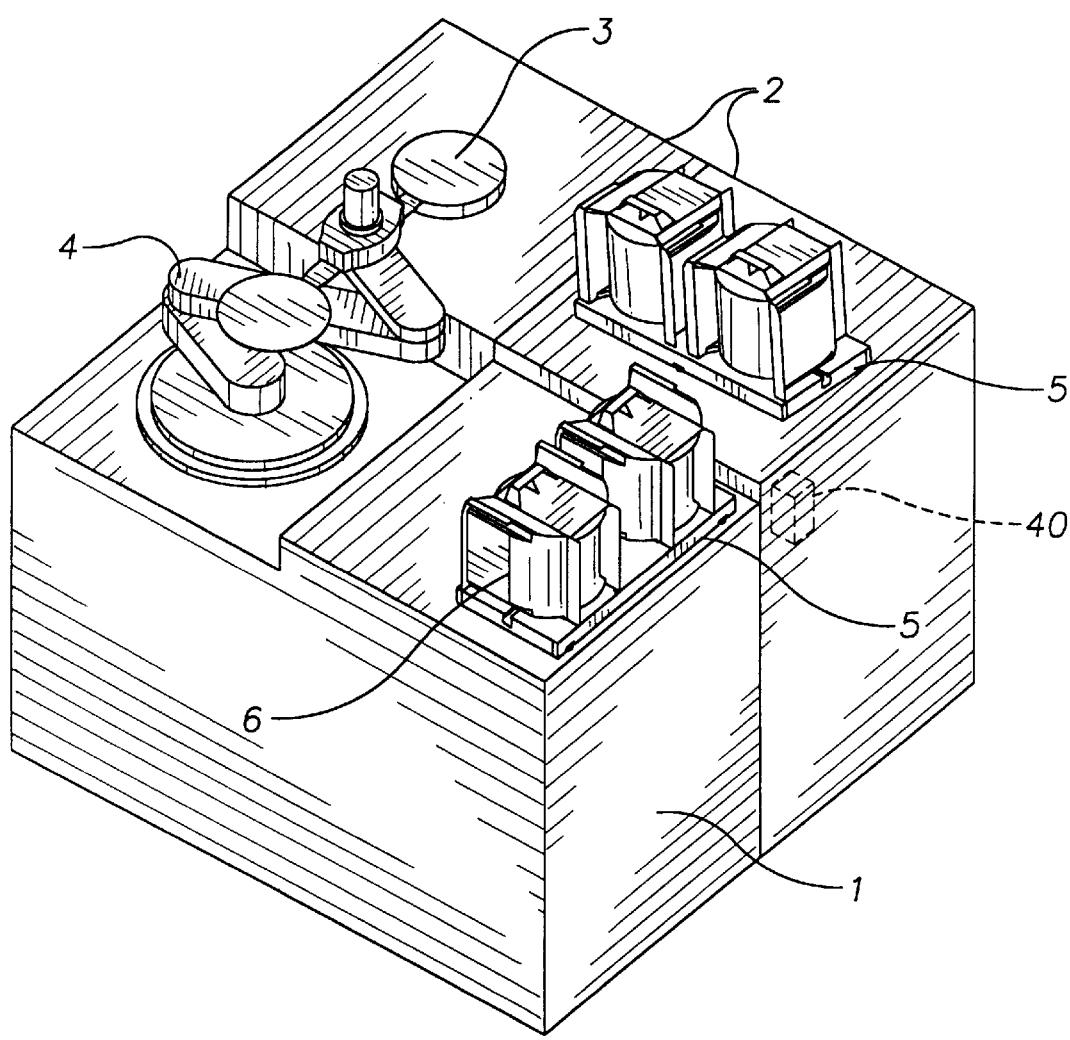
FIG. 1 is a perspective view of the Material Handling Unit with a removably attached robot and a removably attached auto-sizing semiconductor wafer/substrate cassette station with two removably attached cassettes and two process modules docked to the Material Handling Unit wherein one of the process modules contains a removably attached Thermal Processing Chamber and the other process module contains a removably attached auto-sizing semiconductor wafer/substrate cassette station with two removably attached cassettes.

With reference now to the drawings, and in particular to FIGS. 1–14 thereof, a new, novel and useful automatic module and cassette station detecting and aligning semiconductor wafer/substrate material handling unit with a thermal processing chamber module having an integrated, sturdy, chemical and temperature resistant wafer lift pins and door actuation apparatus embodying the principles and concepts of the present invention and generally designated collectively by the reference numerals 1, 2, 3, 5 and 35 in FIGS. 1–14 will be described.

Figure 2:
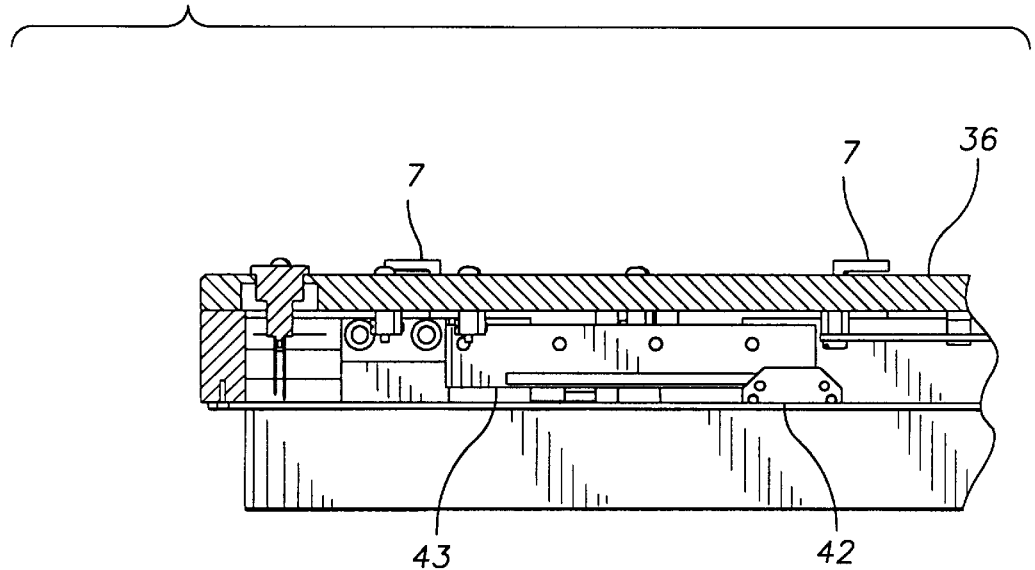
FIG. 2 is a perspective view of the auto-sizing semiconductor wafer/substrate cassette station with one cassette removably attached thereto and a front sectional view of the cassette platform of the present invention with X, Y, and Z axises depicted thereon.
Figure 2:
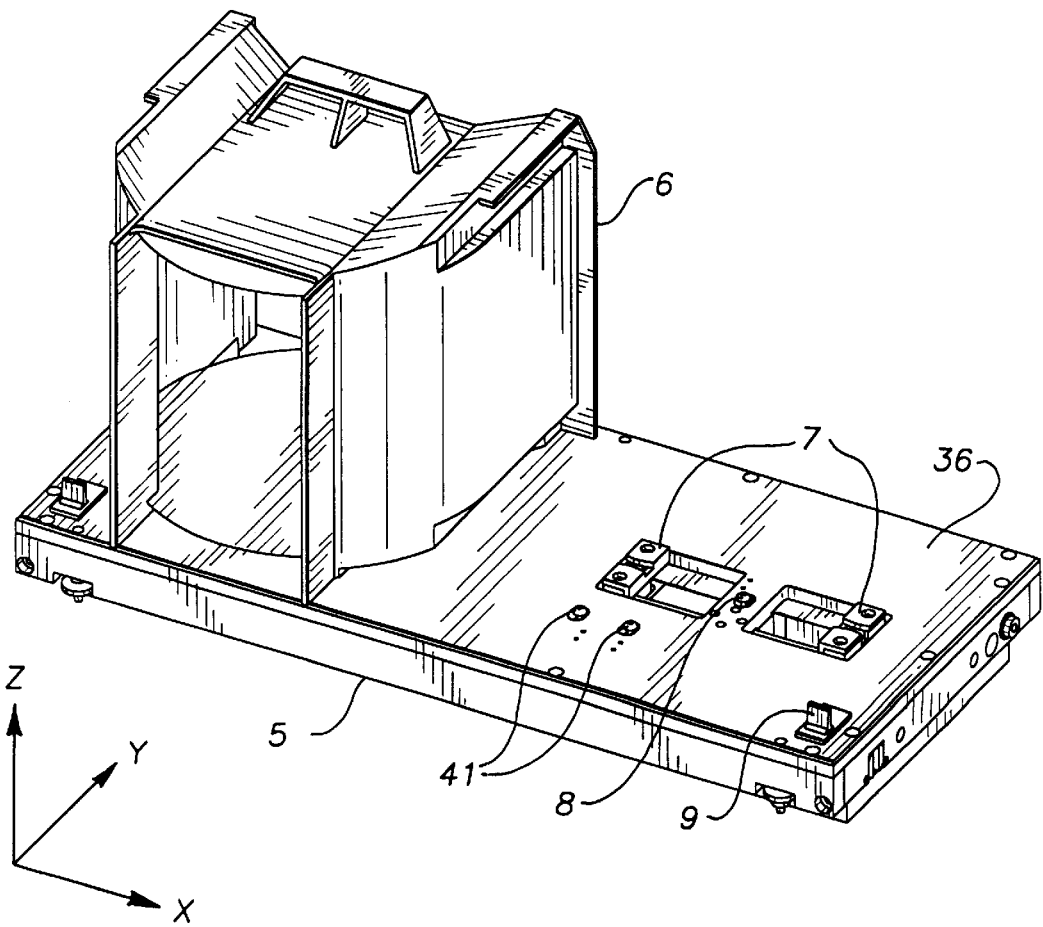
Figure 8:
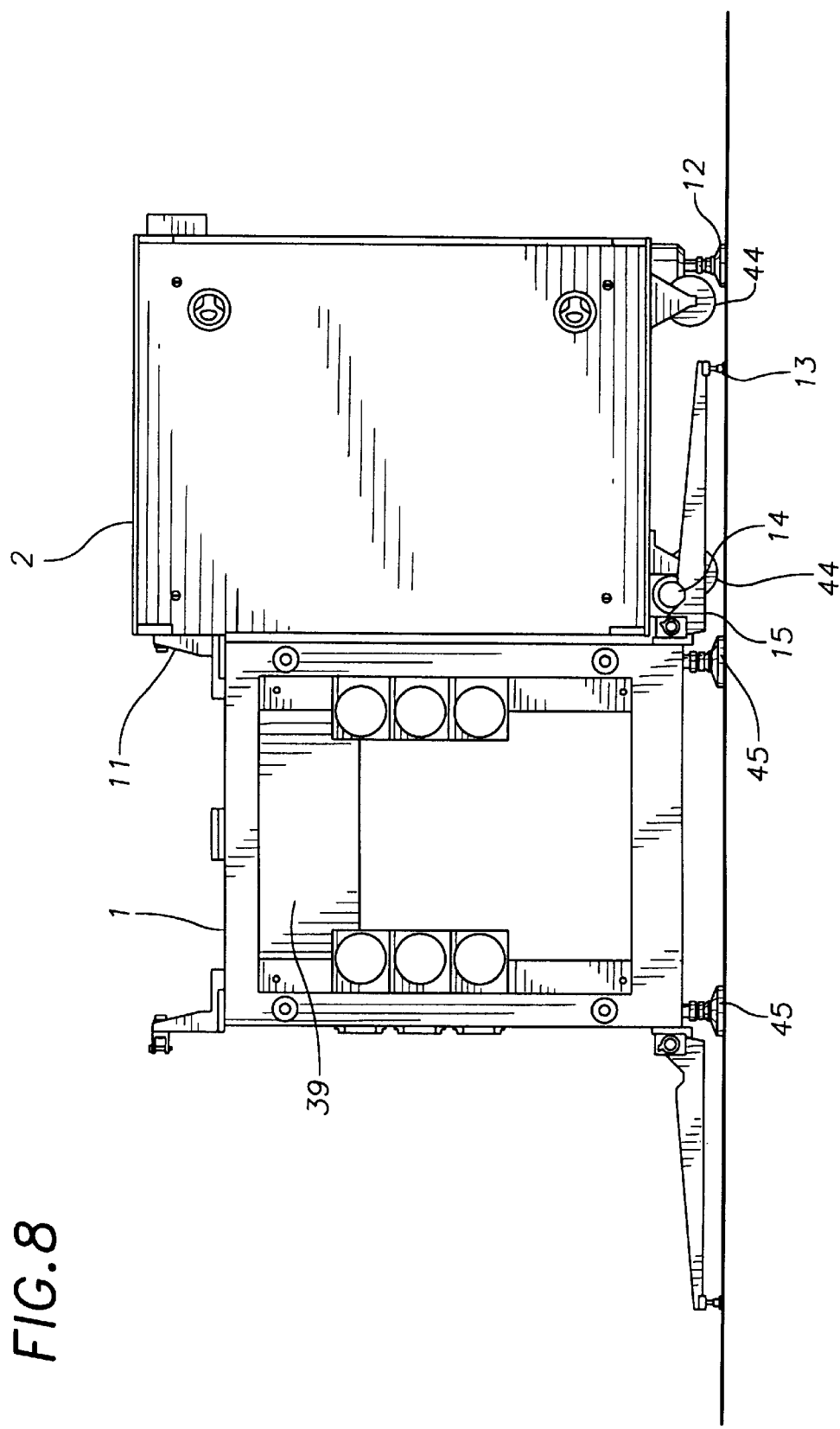
FIG. 8 is a side view of the Material Handling Unit with a removably docked process module.
Figure 14:
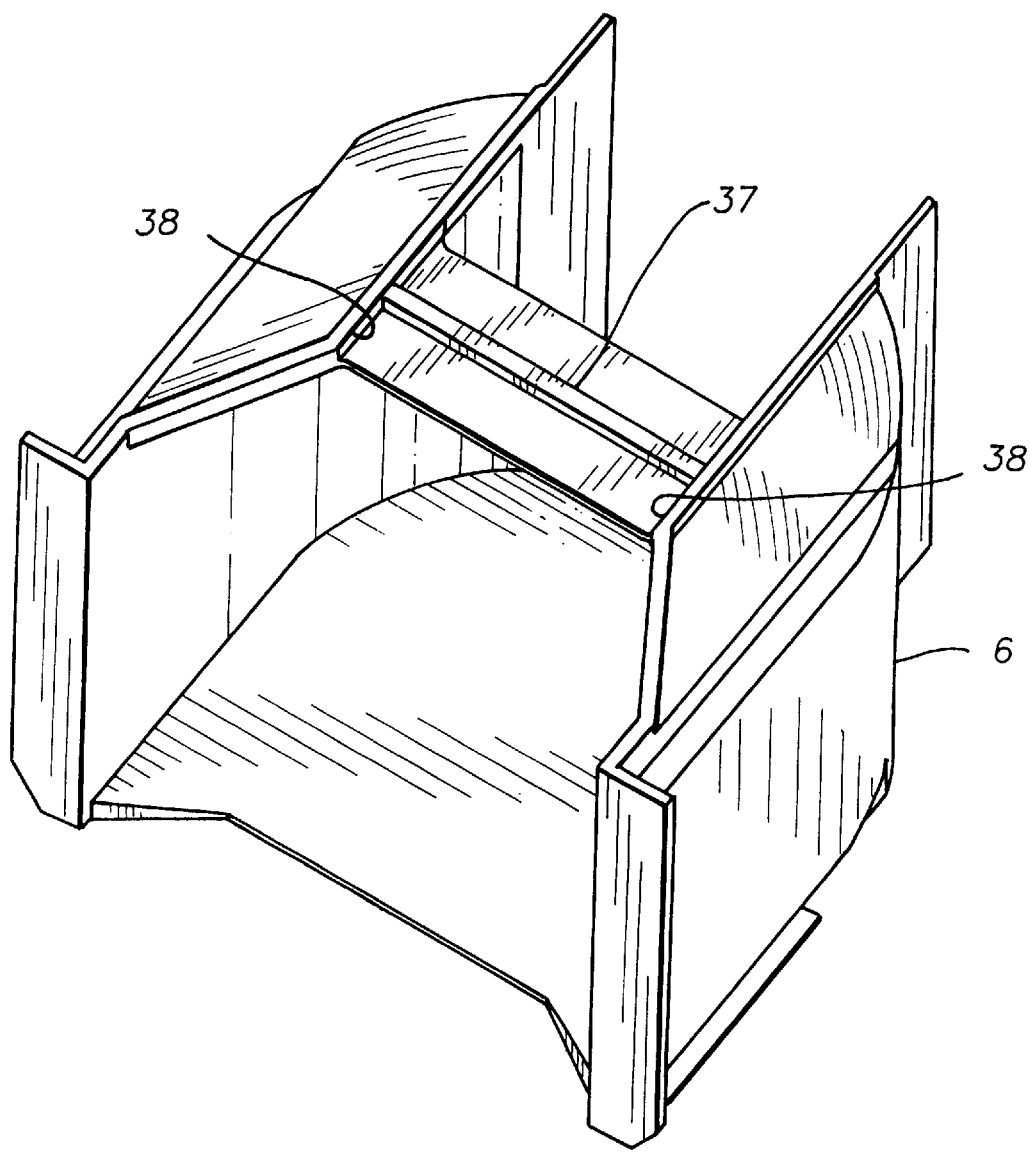
FIG. 14 is a perspective bottom view of the cassette.

FIG. 1 shows the auto-sizing semiconductor Wafer/Substrate Cassette Station 5 with two cassettes 6 removably attached to the auto-sizing semiconductor Wafer/Substrate Cassette Station 5 which is removably attached to the material handling unit 1 in accordance with this invention for an automatic module and cassette station detecting and aligning semiconductor wafer/substrate material handling unit with a thermal processing chamber module having an integrated, sturdy, chemical and temperature resistant wafer lift pins and door actuation apparatus. FIG. 1 also shows the auto-sizing semiconductor Wafer/Substrate Cassette Station 5 with two cassettes 6 removably attached to the auto-sizing semiconductor Wafer/Substrate Cassette Station 5 which is removably attached to a processor module 2 which is a fully functional additional location for the auto-sizing semiconductor Wafer/Substrate Cassette Station 5. The central processing unit or main computer 39 of FIG. 8 having received the communication from the auto-sizing cassette station 5 and the communication from the module microprocessors 40 of any process module 2 being docked to the material handling unit 1 may now in accordance with user defined specifications engage the robot 4 to retrieve wafers from the cassettes 6 and handle them in a precise manner delivering and retrieving them from the removably docked process modules 2. FIG. 1 further depicts a process module 2 with a thermal processing chamber 3, which thermal processing chamber 3 is further depicted in an exploded perspective view in FIG. 12;

FIG. 2 shows the auto-sizing semiconductor Wafer/Substrate Cassette Station 5 in accordance with this invention for an automatic module and cassette station detecting and aligning semiconductor wafer/substrate material handling unit with a thermal processing chamber module having an integrated, sturdy, chemical and temperature resistant wafer lift pins and door actuation apparatus. As indicated therein, the auto-sizing semiconductor Wafer/Substrate Cassette Station 5 comprises four primary components, including up to two cassettes 6 removably attached to a cassette platform 36 that has movably attached thereto an alignment jaw 7, a cassette presence switch 8, and an operator actuated switch 9. The auto-sizing semiconductor Wafer/Substrate Cassette Station 5 shown in FIGS. 1–2 is operated by rigidly, but removably attaching up to two cassettes 6 on the cassette platform 36 (FIG. 2 depicts the cassette platform 36 with one cassette 6 in place and one cassette 6 removed but not shown and FIG. 1 shows four cassettes 6 two each removably attached to the two cassette platforms 36, one of which is attached to a process module 2, the other of which is attached to the material handling unit 1). The cassette platform 36 is rigidly but removably attached to the material handling unit 1 as shown in FIG. 1. The auto-sizing semiconductor Wafer/Substrate Cassette Station 5 can also be functionally, rigidly, but removably attached to a process module 2 as depicted in FIG. 1. The cassette platform 36 constrains the level and Z orientations of the cassette 6 as delineated in FIG. 2. A cassette H bar 37 on the cassette 6 as shown in FIG. 14 is located on the two jaws of the alignment jaw 7 which defines the Y and rotational (about Z) orientations delineated in FIG. 2. The cassette presence switch 8 detects the presence of the cassette 6. The user actuated switch 9 commands the two jaws of the alignment jaw 7 to travel in an opposed synchronous fashion contacting cassette runners 38 as depicted in FIG. 14 on the cassette 6 positioning it centrally about a known point defining the X orientation delineated in FIG. 2. The distance between the jaws of the alignment jaw 7 is automatically measured using a linear encoder 42 by use of a linear encoder code strip 43 and is serially communicated along with two discrete cassette ID switches 41 to the central processing unit or main computer 39 of the material handling unit 1 as depicted in FIG. 8. The central processing unit or main computer 39 depicted in FIG. 8 then processes this information to know what size and/or shape cassette 6 is in place. With this information now communicated to the central processing unit or main computer 39 depicted in FIG. 8, the central processing unit or main computer 39 may now precisely and automatically control the material handling unit 1 robot 4 depicted in FIG. 1 to retrieve wafers, which have been placed in the precise location for retrieval by the auto-sizing semiconductor wafer/substrate cassette station 5, from the cassette 6 for processing within one or more process modules 2.

Figure 3:
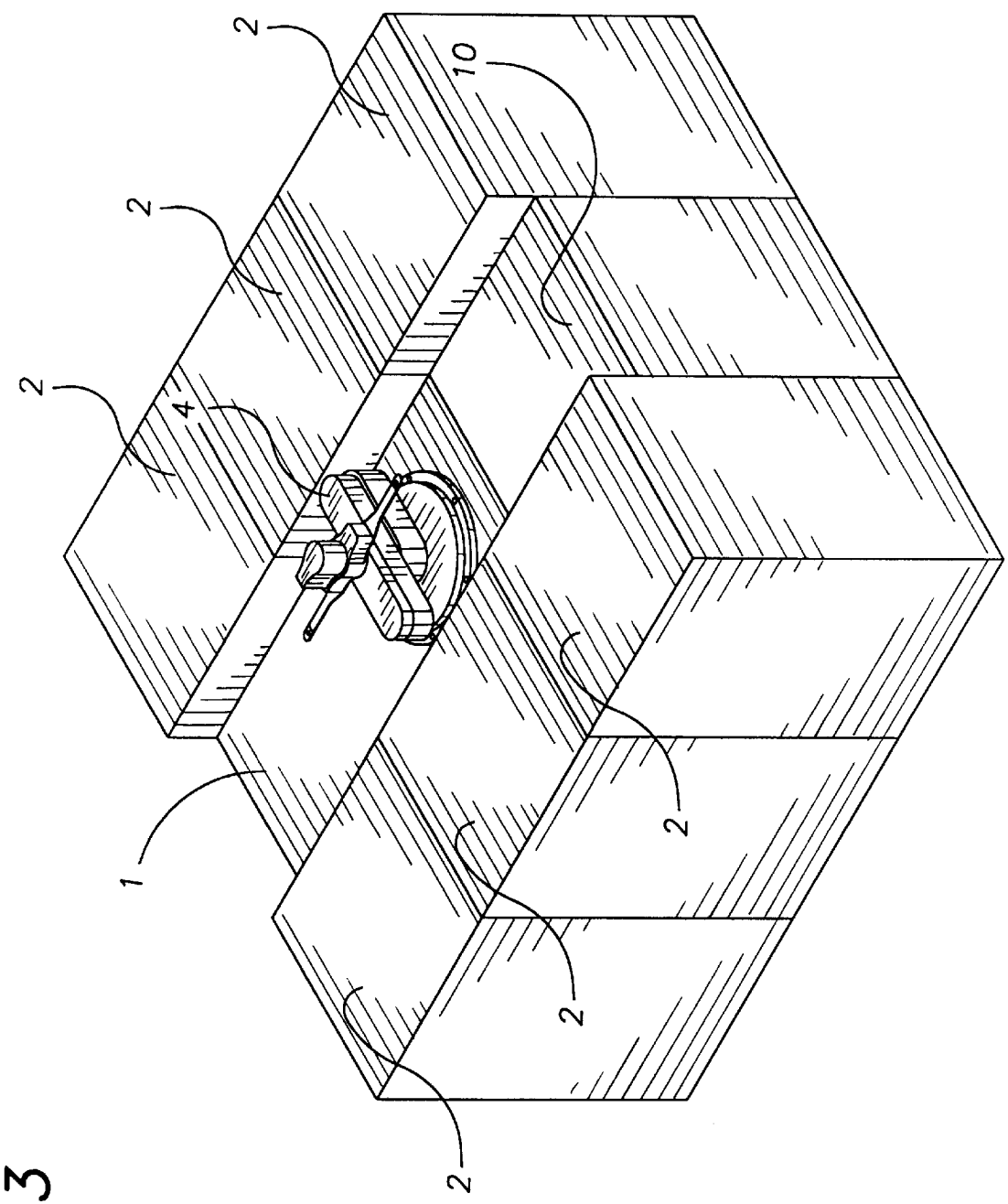
FIG. 3 is a perspective view of the Material Handling Unit with one removably attached Material Handling Unit Extension and six process modules removably docked thereto.

FIG. 3 shows the material handling unit 1 and removably attached robot 4 with a removably attached material handling unit extension 10 which permits the removable docking of additional process modules 2 which facilitates in the configuration depicted in FIG. 3 up to six different, or any combination of, process modules 2 which may be removably docked to the material handling unit 1. The robot 4 then automatically moves wafers to and from various processing modules 2 in accordance with user defined parameters, all of which is controlled by the central processing unit or main computer 39 as shown in FIG. 8.

Figure 4:
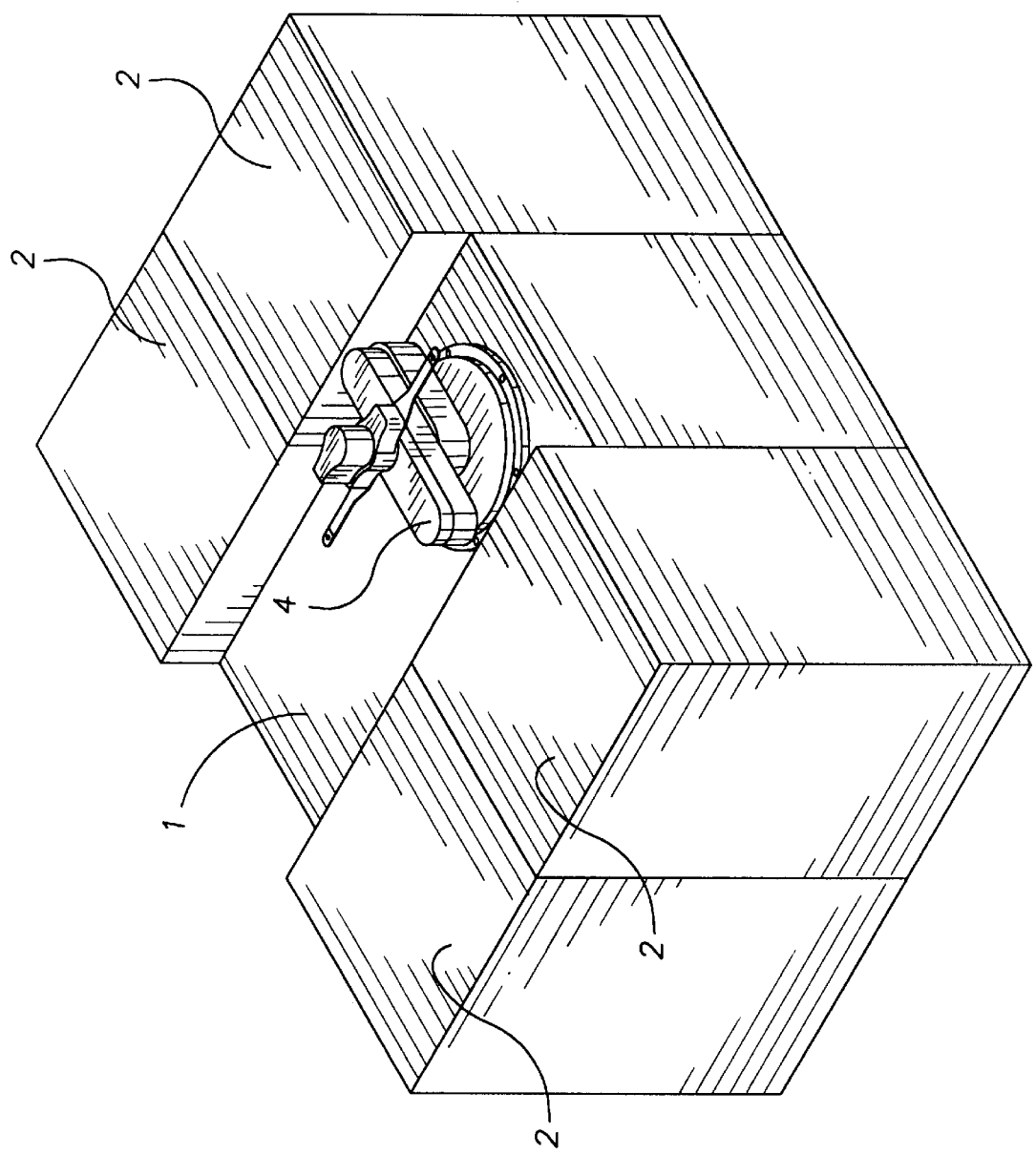
FIG. 4 is a perspective view of the Material Handling Unit with four process modules removably docked thereto.

FIG. 4 shows the material handling unit 1 and removably attached robot 4 with removably docked process modules 2 which facilitates in the configuration depicted in FIG. 4 up to four different, or any combination of, process modules 2 to be removably docked to the material handling unit 1. The robot 4 then automatically moves wafers to and from various processing modules 2 in accordance with user defined parameters, all of which is controlled by the central processing unit or main computer 39 as shown in FIG. 8.

Figure 5:
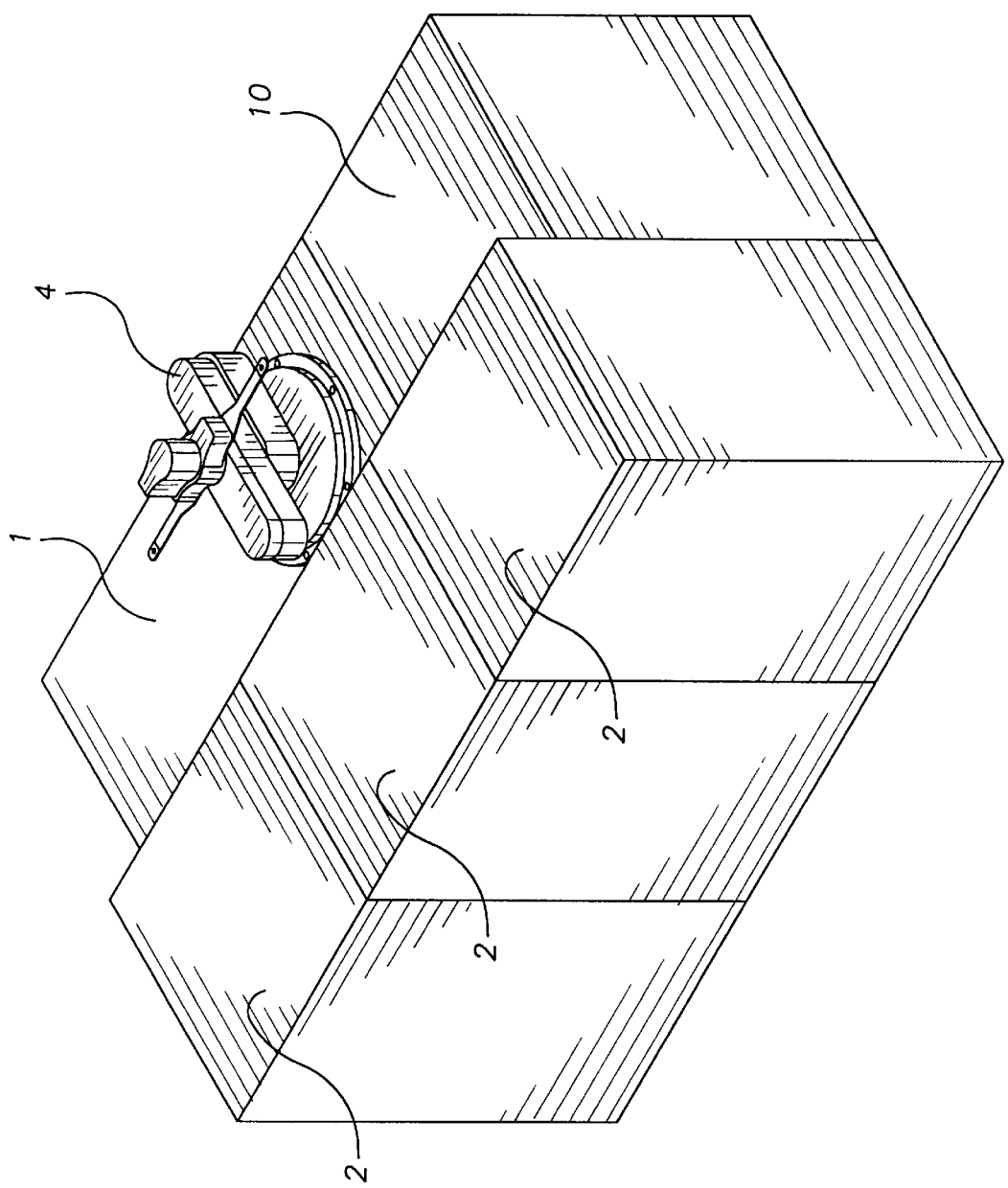
FIG. 5 is a perspective view of the Material Handling Unit with one removably attached Material Handling Unit Extension and three process modules removably docked thereto.

FIG. 5 shows the material handling unit 1 and removably attached robot 4 with a removably attached material handling unit extension 10 which permits the docking of additional process modules 2 which facilitates in the configuration depicted in FIG. 5 up to six different, or any combination of, process modules 2 to be docked to the material handling unit 1, however, FIG. 5 shows the apparatus with three process modules 2 removably docked to the material handling unit 1, even though the apparatus as depicted can accommodate up to six process modules 2. The robot 4 then automatically moves wafers to and from various processing modules 2 in accordance with user defined parameters, all of which is controlled by the central processing unit or main computer 39 as shown in FIG. 8.

Figure 6:
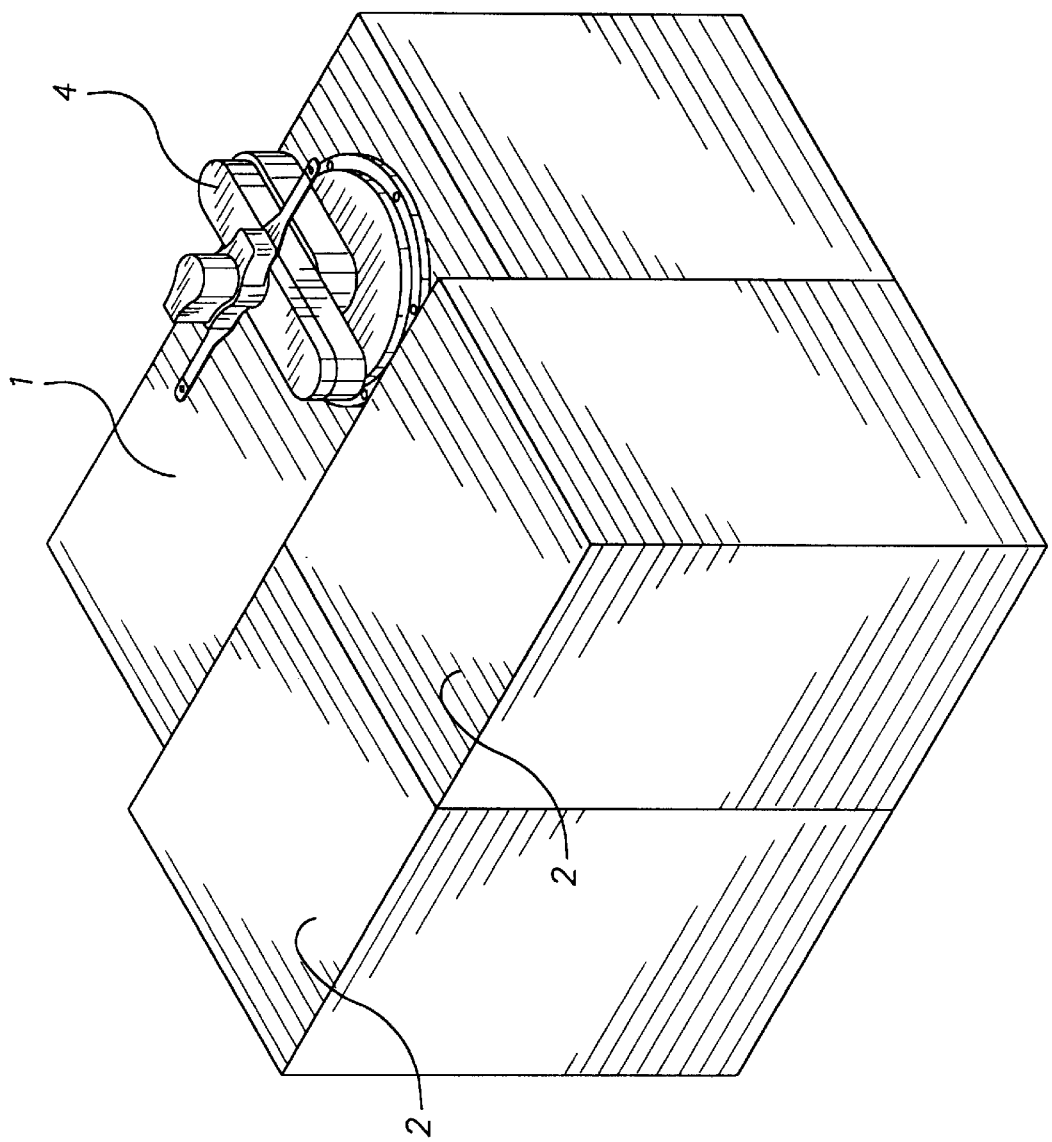
FIG. 6 is a perspective view of the Material Handling Unit with two process modules removably docked thereto.

FIG. 6 shows the material handling unit 1 and removably attached robot 4 with removably docked process modules 2 which facilitates in the configuration depicted in FIG. 4 up to four different, or any combination of, process modules 2 to be removably docked to the material handling unit 1, however, FIG. 6 shows the apparatus with two process modules 2 removably docked to the material handling unit 1, even though the apparatus as depicted can accommodate up to four process modules 2. The robot 4 then automatically moves wafers to and from various processing modules 2 in accordance with user defined parameters, all of which is controlled by the central processing unit or main computer 39 as shown in FIG. 8.

Figure 7:
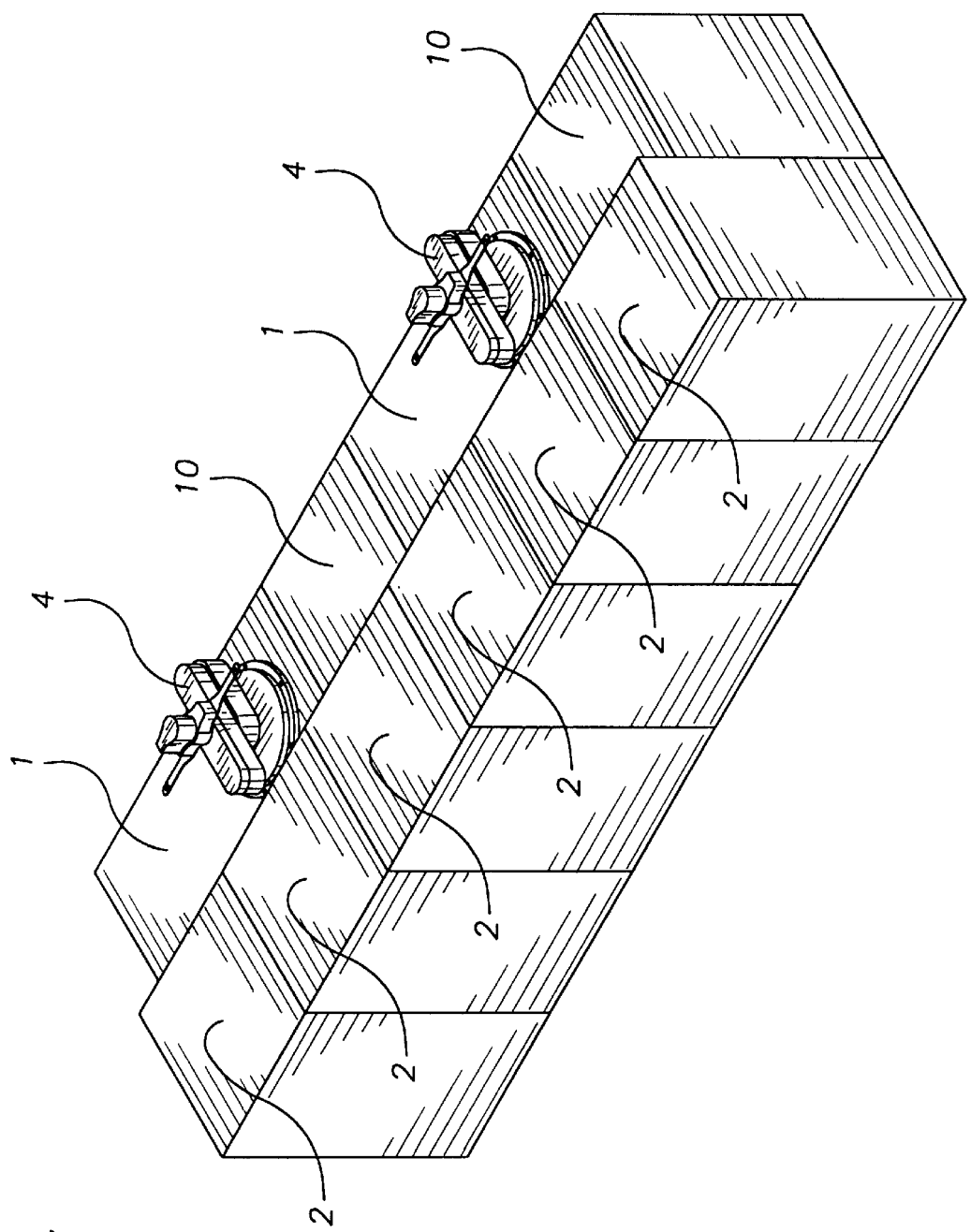
FIG. 7 is a perspective view of two clustered Material Handling Units with two removably attached Material Handling Unit Extensions and six process modules removably docked thereto.

FIG. 7 shows the clustering of two material handling units 1 and two respective removably attached robots 4 with two removably attached material handling unit extensions 10 which permits the docking of additional process modules 2 which facilitates in the configuration depicted in FIG. 7 up to twelve different, or any combination of, process modules 2 to be docked to the two clustered material handling units 1 and the two removably attached material handling unit extensions 10, however, FIG. 7 shows the apparatus with six process modules 2 removably docked to the two clustered material handling units 1 and the two removably attached material handling unit extensions 10, even though the apparatus as depicted can accommodate up to twelve process modules 2. The robot 4 then automatically moves wafers to and from various processing modules 2 in accordance with user defined parameters, all of which is controlled by the central processing unit or main computer 39 as shown in FIG. 8. Additional material handling units 1 in excess of two may be clustered together by stacking them end to end with material handling unit extensions 10 which could then be removably docked with a proportionate number of process modules 2.

Figure 9:
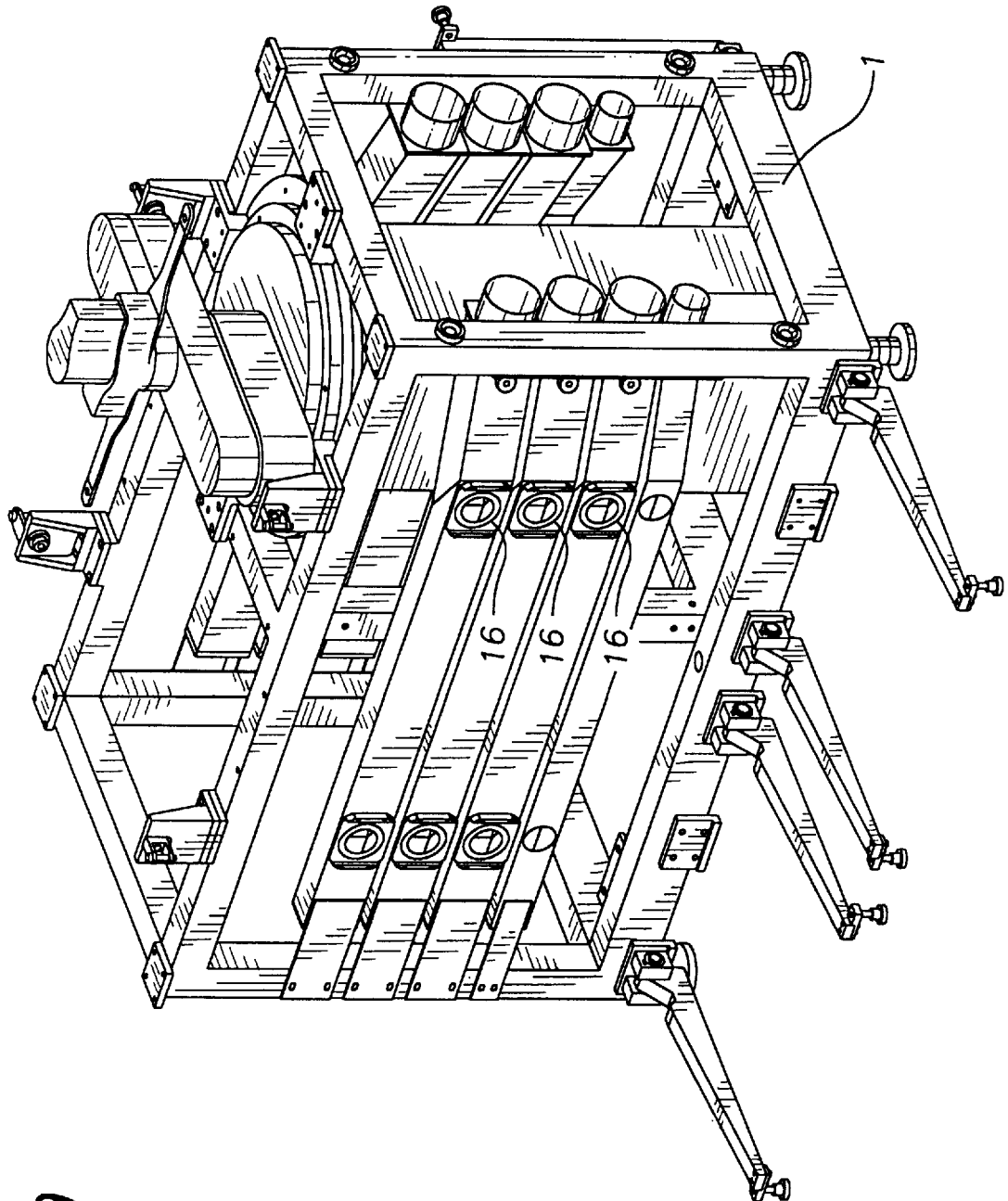
FIG. 9 is a perspective view of the Material Handling Unit without a casing jacket depicting the exhaust manifold, robot and MHU docking ramps thereof.
Figure 10:
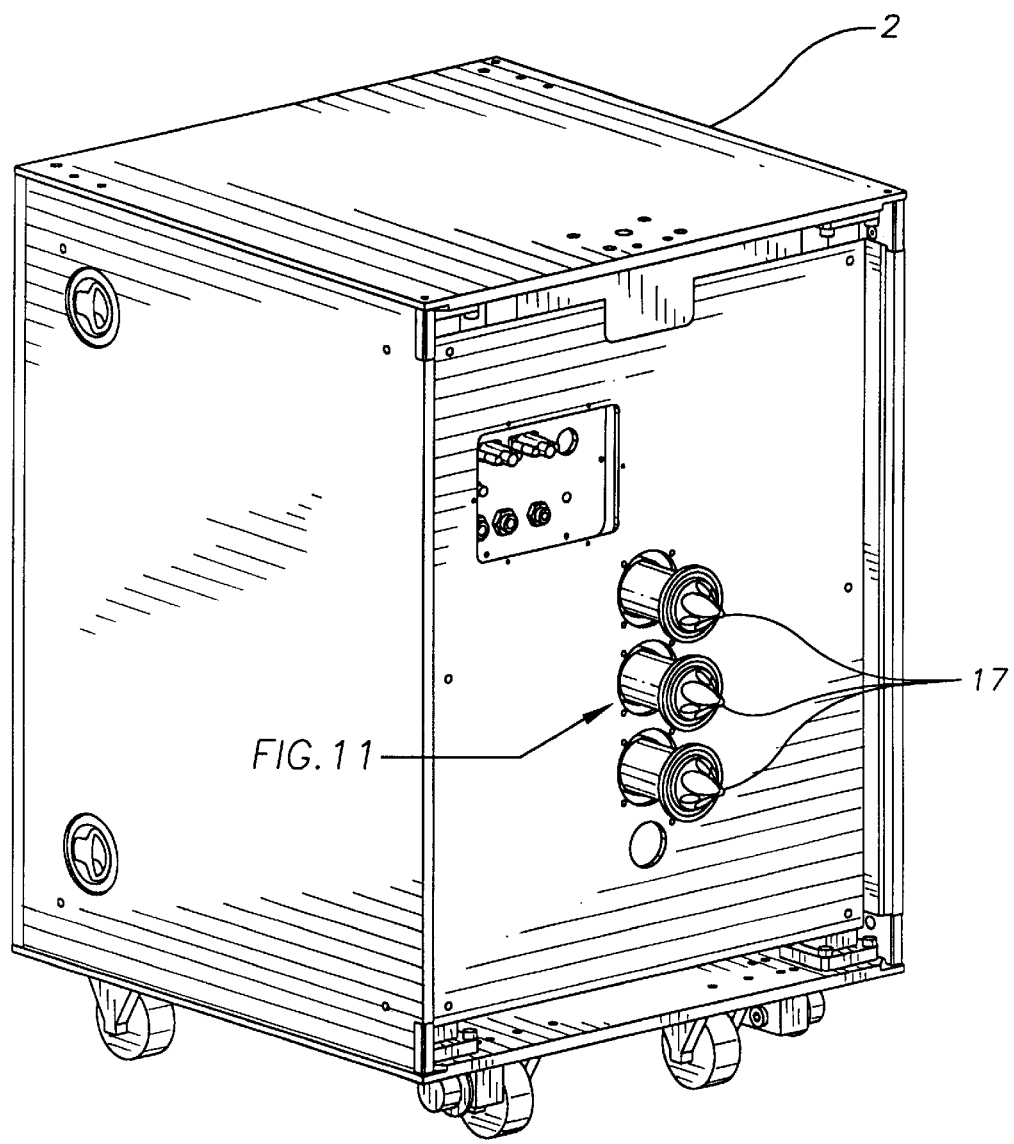
FIG. 10 is a perspective view of an undocked process module depicting the process module exhaust interface connection.

FIG. 8 depicts the apparatus' docking components in accordance with this invention. The interface between the material handling unit 1 and the process modules 2 is standardized so that any type of process module 2 may be removably docked at any docking location on the material handling unit 1. The interface between the material handling unit extensions 10 and the process modules 2 is standardized so that any type of process module 2 may be removably docked at any docking location on a material handling unit extension 10. As shown in FIG. 9 the material handling unit 1 has two pivotally attached MHU docking ramps 15 for each process module 2 or eight MHU docking ramps 15 in total for each material handling unit 1, four on each opposite side of the material handling unit 1. Each material handling unit extension 10 has four MHU docking ramps 15, two on each opposite side of the material handling unit extension 10. When there is no process module 2 removably docked to the material handling unit 1 or material handling unit extension 10, the MHU docking ramps 15 may be pivoted to an upright position thus reducing the footprint size of the material handling unit 1 or material handling unit extension 10. Prior to docking the process modules 2, the material handling unit 1 is leveled in place by adjustment of the four MHU leveling feet 45. The MHU docking ramps 15 are then leveled in place by adjusting each of two MHU docking ramp leveling feet 13 for each process module 2 to be docked. Once the material handling unit 1 and the MHU docking ramps are leveled, the process modules 2, as depicted in FIGS. 8 and 10, are docked to the material handling unit 1 by rolling the process module 2 on its four module casters 44 between the MHU docking ramps 15 such that the process module exhaust interface connection 17 as depicted in FIG. 10 is facing toward the material handling unit 1 and the MHU exhaust interface port 16 as depicted in FIG. 9. As the process module 2 is pushed closer to the material handling unit 1 the two self-aligning tapered process module rollers 14 engage the MHU docking ramp 15 lifting the process module 2 off the ground level pivotally about the axis of the two module casters 44 furthest away from the material handling unit 1 until the two self aligning tapered process module rollers 14 seat in the notches of the two corresponding MHU docking ramps 15. The process module 2 docking is then completed by rotating the process module 2 about the two self aligning tapered process module rollers 14 up against the MHU latch clevis assembly 11 and latched which constrains the final two orientations (in the direction of the rotational axis and angle of rotation about the rotational axis of the rollers 14). The two process module leveling feet 12 are then brought into light contact with the floor to provide for additional support for the process module 2. Fine level adjustments can then be accomplished by unlatching the MHU latch clevis assembly 11, adjusting the MHU docking ramp leveling feet 13 and the process module leveling feet 12 and then re-latching the MHU latch clevis assembly 11. Once the process module 2 is leveled and securely latched by the MHU latch clevis assembly 11 in place after initial docking, the MHU docking ramps 15 engagement of the two self aligning tapered process module rollers 14 docks the process module 2 in the precise location with respect to the material handling unit 1 for use without a need to retrain the robot 4. The securing of the latching of the process module 2 with the MHU latch clevis assembly 11 self-seals the self-aligned exhaust interface between the process module exhaust interface connection 17 as depicted in FIG. 10 and the MHU exhaust interface port 16 as depicted in FIG. 9. The docking procedure is completed by: connecting the serial connection of the module microprocessor 40 of the process module 2 as depicted in FIG. 1 to the central processing unit or main computer 39 as shown in FIG. 8; connecting the high and low power source from the material handling unit 1 to the processing module(s) 2; connecting the air pressure lines from the material handling unit 1 to the processing module(s) 2; connecting the vacuum line from the material handling unit 1 to the processing module(s) 2; and connecting the chemical conduit from the material handling unit 1 to the processing module(s) 2.

Figure 11:
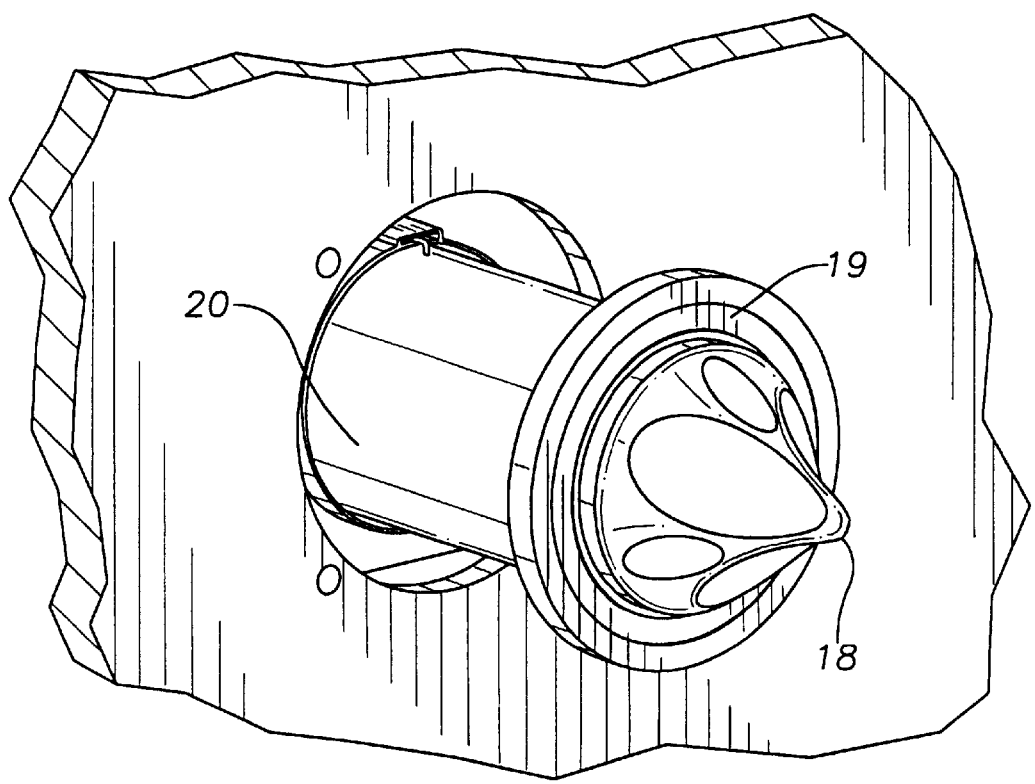
FIG. 11 is an exploded perspective view of the process module exhaust interface connection.

FIGS. 9, 10 and 11 show the self-aligning and self-sealing exhaust interface between the material handling unit 1 and the process modules 2. The process module 2 portion of the exhaust interface as depicted in FIGS. 10 and 11 consists of three process module exhaust ports 46 each of which are comprised of a process module exhaust interface connection 17, a tapered alignment nozzle 18, an O-ring seal 19 and a spring loaded flexible tube 20. When the process module 2 is removably docked to a material handling unit 1 or material handling unit extension 10 the tapered portion of the tapered alignment nozzle 18 self aligns with the inside diameter of the MHU exhaust interface port 16 of the material handling unit 1 as depicted in FIG. 9. As docking is being completed the module exhaust interface connection 17, which is fitted with the O-ring seal 19 makes contact with the MHU exhaust interface port 16 of the material handling unit 1 as depicted in FIG. 9 and is forced into proper sealing position by the spring loaded flexible tube 20 which applies enough force to maintain a vacuum tight joint in the exhaust interface.

Figure 12:
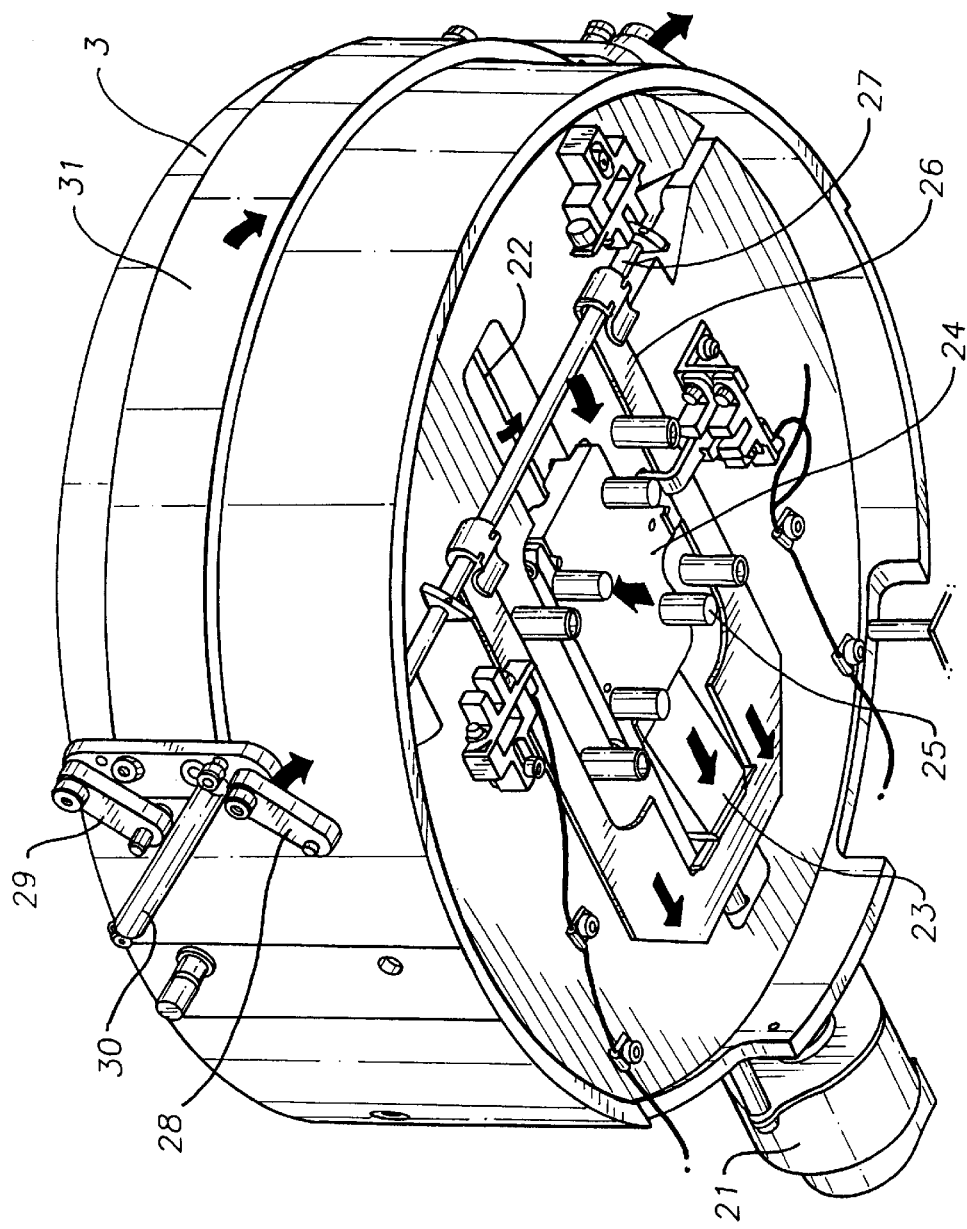
FIG. 12 is an exploded perspective view of the Compact Wafer Lift Pin and Door Actuation Mechanism of the Thermal Processing Chamber with sturdy, chemical and temperature resistant Wafer Lift Pins.

FIG. 12 shows the underside of the thermal processing chamber 3 which is removably attached to a process module 2 as shown in FIG. 1. The thermal processing chamber 3 is operatively controlled by the central processing unit or main computer 39 through the module microprocessor 40 of the process module 2 to which the thermal processing chamber 3 is removably attached. While causing the robot 4 to load or retrieve a wafer from the thermal processing chamber 3 the central processing unit or main computer 39 causes the thermal processing chamber 3 drive motor 21 to engage. The drive motor 21 drives a lead screw 22 the nut of which is removably mounted in a broad wedge-shaped cam 23 which is therefore driven in a horizontal straight track by the drive motor's 21 rotary motion. The inclined plane of the wedge-shaped cam 23 is matched by an inclined plane on the pin carriage 24. The linear motion of the wedge-shaped cam 23 is then translated into a vertical linear motion and a mechanical advantage is obtained. The contact between the wedge-shaped cam 23 and the pin carriage 24, and the level of the pin carriage 24 is accomplished by removably attached pre-loaded pin springs 25. A number (normally three) of sturdy, chemical and temperature resistant lift pins 35 are rigidly but removably attached to the pin carriage 24 and pass through openings into the chamber of the thermal processing chamber 3 to contact and elevate the wafer being processed. When the sturdy, chemical and temperature resistant lift pins 35 reach their fully upright loading/unloading position they contact a stop surface and cease their upward travel. The wedge-shaped cam 23 continues its linear travel as its inclined plane separates from the inclined plane of the pin carriage 24. The wedge-shaped cam 23 then contacts and begins to move the door pull bar 26 which in turn causes the door pivot rod 27 to rotate. Twin doors arms 28 rigidly but removably attached to the ends of the door pivot rod 27 then swing out and down. The chamber door 31 is attached to the moving end of the two door arms 28 and two additional door guide arms 29 which together comprise a substantially parallel four bar linkage at either side of the chamber door 31. While the chamber door 31 is being opened to accept delivery or retrieval of a wafer into the chamber of the thermal processing chamber 3 the chamber door 31 is constrained to move outward from the sealing surface on the thermal processing chamber 3 and downward in a curvilinear fashion until a clear path is provided for the robot 4 to directly load/unload the wafers being processed. Once the wafer is loaded/unloaded by the robot 4 the drive motor 21 is reversed by the central processing unit or main computer 39 through the process module's 2 module microprocessor 40 ultimately retracting the sturdy, chemical and temperature resistant lift pins 35 and door opening assembly to its original position before the chamber door 31 opening process was initiated. Once retracted the chamber door 31 is closed by two door close springs 30 pivotally and removably attached on one end to the outside wall of the thermal processing chamber 3 and each on the other end removably attached to the two door guide arms 29.

Figure 13:
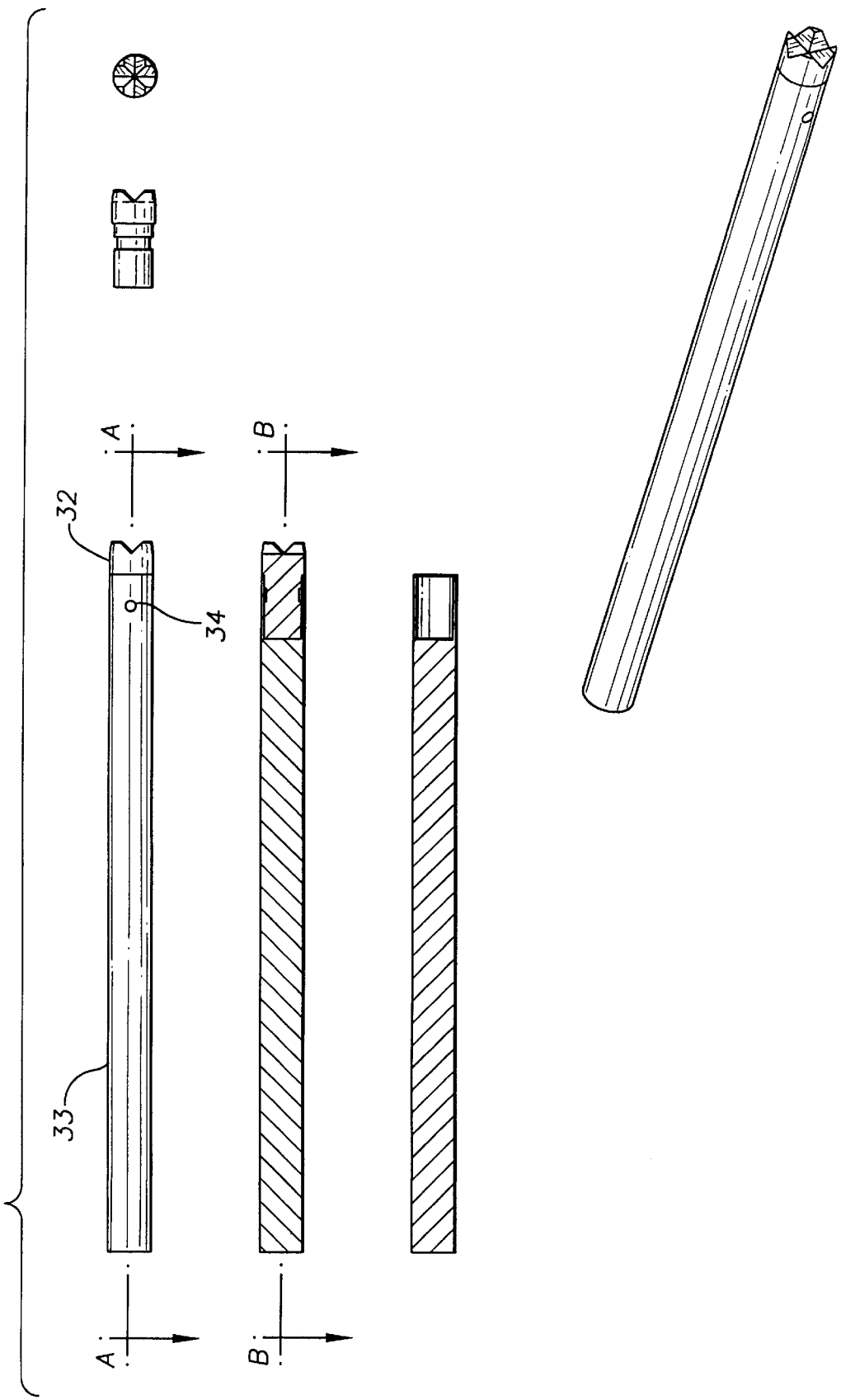
FIG. 13 is a side and perspective view of the sturdy, chemical and temperature resistant Wafer Lift Pins of the Thermal Processing Chamber.

FIG. 13 shows the sturdy, chemical and temperature resistant lift pins 35 used to lift the wafers in the thermal processing chamber 3 as depicted in FIG. 12. The sturdy, chemical and temperature resistant lift pins 35 are composed of a sturdy, chemical and temperature resistant material such as stainless steel. The lift pin tip 32 may also be comprised of a material of very low thermal conductivity such as DuPont Vespel™. The pin body 33 has a hole provided for mounting the lift pin tip 32 which has a corresponding mating surface and dimpling to hold the lift pin tip 32 in the hole of the pin body 33 and is secured in place by a retaining prick punch 34. The wafer contact end of the lift pin tip 32 is split in order to make a number of small contact area surfaces that are spread out widely from one another reducing the thermal impact on the resist coating thickness applied to the wafer being lifted by the sturdy, chemical and temperature resistant lift pins 35 as the wafer is processed in the thermal processing chamber 3. In the preferred embodiment a number of substantially V-shaped notches are cut across the lift pin tip 32 to create protrusions that taper from a broad base to a small contact surface area. This protrusion geometry is highly resistant to breakage from lateral impact such as may occur from a misguided robot 4 because the protrusion resulting from the V-shaped notches of the lift pin tip 32 is broadest in the radial direction giving the greatest moment of inertia and resistance to bending.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

Having described the invention, we claim:

1. A new and improved Automatic Modular Wafer Substrate Handling Device comprising:

a central processing unit;

one or more material handling unit in electronic communication with said central processing unit;

one or more process module removably attached by a self sealing, self-aligning and self-leveling docking means to said material handling unit wherein said process module is in electronic communication with said central processing unit utilizing a removably attached electronic self recognition means which causes said central processing unit to automatically recognize said process module and said process module's function;

one or more auto-sizing cassette station removably attached to said material handling unit and/or said process module wherein said auto-sizing cassette station is in electronic communication with said central processing unit utilizing a removably attached electronic wafer size detection means which causes said central processing unit to automatically spatially align and recognize the size of said wafer stored in said auto-sizing cassette station;

one or more wafer handling robot means removably and rotatably attached one each to said material handling unit wherein said wafer handling robot means is in electronic communication with said central processing unit such that said central processing unit may electronically direct said wafer handling robot means to retreive and deliver said wafer to and from said auto-sizing cassette station to and from said process module in any combination thereof according to user defined parameters;

one or more thermal processing chamber removably attached one each to one or more of said process module wherein said thermal processing chamber is in electronic communication with said central processing unit;

a plurality of chemical and temperature resistant lift pins removably and movably attached to said thermal processing chamber wherein said chemical and temperature resistant lift pins are further comprised of an actuation contact end and a substrate contact end wherein said substrate contact end is split into a plurality of wafer contact area surfaces low in thermal impact;

a thermal processing chamber door means removably and pivotally attached to said thermal processing chamber wherein said thermal processing chamber door means is in electronic communication with said central processing unit such that said central processing unit may control said thermal processing door means to obtain an open or a closed position according to user defined parameters; and a lift pin actuation means removably attached to said thermal processing door means wherein said chemical and temperature resistant lift pins are contacted by said lift pin actuation means upon said actuation contact end of said chemical and temperature resistant lift pins causing said chemical and temperature resistant lift pins to move to a user defined position when said thermal processing chamber door means is in said open position and when said thermal processing chamber door means is in said closed position said lift pin actuation means causes said chemical and temperature resistant lift pins to move to an alternative user defined position which may include said user defined position.

* * * * *